(12) United States Patent
Lin

(10) Patent No.: US 10,742,246 B2
(45) Date of Patent: Aug. 11, 2020

(54) RECEIVER PATH ARRANGEMENT

(71) Applicant: NXP B.V.

(72) Inventor: Yu Lin, Utrecht (NL)

(73) Assignee: NXP B.V., Eindhoven (NL)

( * ) Notice: Subject to any disclaimer, the term of this patent is extended or adjusted under 35 U.S.C. 154(b) by 280 days.

(21) Appl. No.: 15/847,964

(22) Filed: Dec. 20, 2017

(65) Prior Publication Data

US 2018/0183471 A1 Jun. 28, 2018

(30) Foreign Application Priority Data

Dec. 22, 2016 (EP) .................................. 16206122

(51) Int. Cl.
*H04B 1/10* (2006.01)
*G01S 7/35* (2006.01)
(Continued)

(52) U.S. Cl.
CPC .............. *H04B 1/109* (2013.01); *G01S 7/292* (2013.01); *G01S 7/354* (2013.01); *G01S 13/286* (2013.01);
(Continued)

(58) Field of Classification Search
CPC ......... H04B 1/109; G01S 7/292; G01S 7/354; G01S 7/038; G01S 7/35; G01S 13/286;
(Continued)

(56) References Cited

U.S. PATENT DOCUMENTS 5,646,623 A * 7/1997 Walters ................... G01S 13/32
342/112
5,987,395 A 11/1999 Donges
(Continued)

FOREIGN PATENT DOCUMENTS

DE 196 24 043 A1 12/1997
DE 10 2010 002 004 A1 8/2011

OTHER PUBLICATIONS

Altera Corporation Implementing Digital Processing for Automotive Radar Using Socs WP-01183-1 .3 White Paper; pp. 1-16 (Sep. 2013).

(Continued)

*Primary Examiner* — Timothy A Brainard
*Assistant Examiner* — Michael W Justice
(74) *Attorney, Agent, or Firm* — Rajeev Madnawat

(57) ABSTRACT

A receive path arrangement of a radar sensor of FMCW type comprising a first and second receive path configured to receive reflected radar signals for detection and ranging of objects in a space around the radar sensor;

the first receive path configured to provide reflected radar signals between a first and second beat frequency to a first analogue to digital converter for subsequent digital signal processing and wherein;

the second receive path includes a second-receive-path filter configured to provide filtered signals by attenuation of the reflected radar signals having frequencies below an intermediate beat frequency, the intermediate beat frequency between the first and second beat frequencies, the second receive path further including a second-receive-path amplifier arrangement configured to provide amplified signals by amplification of the filtered signals and provide the amplified signals to a second analogue to digital converter for subsequent digital signal processing.

15 Claims, 2 Drawing Sheets

(51) Int. Cl.
*G01S 13/931* (2020.01)
*G01S 7/292* (2006.01)
*G01S 13/28* (2006.01)
*G01S 13/24* (2006.01)
*H03M 1/18* (2006.01)
*G01S 7/03* (2006.01)
*G01S 13/44* (2006.01)
*G01S 13/34* (2006.01)

(52) U.S. Cl.
CPC .......... *G01S 13/348* (2013.01); *G01S 13/931* (2013.01); *H03M 1/188* (2013.01); *G01S 7/038* (2013.01); *G01S 13/34* (2013.01); *G01S 13/4454* (2013.01); *G01S 2013/9325* (2013.01)

(58) Field of Classification Search
CPC ...... G01S 13/348; G01S 13/931; G01S 13/34; G01S 13/4454; G01S 2013/9325; G01S 13/53; G01S 7/021; G01S 7/352; H01M 1/188
See application file for complete search history.

(56) References Cited

U.S. PATENT DOCUMENTS

| | | |
|---|---|---|
| 6,023,238 A | 2/2000 | Cornic et al. |
| 6,031,478 A | 2/2000 | Oberhammer et al. |
| 7,683,827 B2 | 3/2010 | Kelly, Jr. et al. |
| 8,026,841 B2 | 9/2011 | Liu et al. |
| 8,068,799 B1 | 11/2011 | Prestwich et al. |
| 8,305,256 B1 | 11/2012 | Manickam et al. |
| 2005/0156780 A1 | 7/2005 | Bonthron et al. |

OTHER PUBLICATIONS

Meinel, H. et al. "Automotive Radar: From Its Origins to Future Directions". Microwave Journal, pp. 24-40 (Sep. 2013).
Analog Devcice, Inc. Analog Devcice, AD8283: Radar Receive Path AFE:6-Channel LNA/PGA/. AAF with ADC Data Sheet, pp. 1-28 (2011).
Rohling, H. "Some Radar Topics: Waveform Design, Range CFAR and Target Recognition", Advances in Sensing With Security Applications NATO Security through Science Series, vol. 2, pp. 293-322 (2006).
Hasch, J. "Driving towards 2020: Automotive radar technology trends", IEEE MTT-S International Conference on Microwaves for Intelligent Mobility, pp. 1-4 (2015).
Texas Instruments AFE5401-Q1: Quad-Channel, Analog Front-End for Automotive Radar Baseband Receiver Data Sheet; online available: http://www.ti.com/lit/ds/symlink/afe5401-q1.pdf.
Morgan, P. et al. "Increasing Automotive Safety with 77/79 GHz Radar Solutions for ADAS Application—FTF-AUT-F0086", Freescale, 37 pgs., retrieved from the internet at: http://cache.freescale.com/files/training/doc/ftf/2014/FTF-AUT-F0086.pdf (Apr. 2014).

* cited by examiner

RECEIVER PATH ARRANGEMENT

CROSS-REFERENCE TO RELATED APPLICATIONS

This application claims the priority under 35 U.S.C. § 119 of European Patent application no. 16206122.0, filed on Dec. 22, 2016, the contents of which are incorporated by reference herein.

The present disclosure relates to a receive path arrangement for a radar sensor and to a radar sensor.

According to a first aspect of the present disclosure there is provided a receive path arrangement of a radar sensor of frequency modulated continuous wave type comprising a first receive path and at least a second receive path, the first and the at least second receive paths configured to receive reflected radar signals for detection and ranging of objects in a space around the radar sensor;

the first receive path configured to provide reflected radar signals between a first beat frequency and a second beat frequency to a first analogue to digital converter for subsequent digital signal processing and wherein;

the second receive path includes a second-receive-path filter configured to provide filtered signals by attenuation of the reflected radar signals having frequencies below an intermediate beat frequency and passing the reflected radar signals above the intermediate beat frequency, the intermediate beat frequency between the first and second beat frequencies, the second receive path further including a second-receive-path amplifier arrangement configured to provide amplified signals by amplification of the filtered signals and provide the amplified signals to a second analogue to digital converter for subsequent digital signal processing.

Thus, in one or more examples, the received signals, which include the reflected radar signals, in the second receive path have low beat frequencies attenuated and therefore higher beat frequencies passed for amplification compared to the first receive path, which does not attenuate (or attenuates to a lesser degree) the low beat frequency signals. In one or more examples, the second-receive-path filter comprises one of a high pass filter and a band-pass filter.

In one or more embodiments, by virtue of at least the second-receive-path filter, the first receive path is configured to provide reflected radar signals in a first frequency band to the analogue to digital converter and the second receive path is configured to provide reflected radar signals in a second frequency band higher than the first frequency band.

In one or more examples, the first and second receive paths may be defined between a branch in a signal path from an antenna configured to receive the reflected radar signals and the respective first and second analogue to digital converter. In one or more examples, the second receive path is configured to provide for greater amplification of the reflected radar signals than the amplification, if any, provided in the first receive path.

In one or more embodiments, the first receive path includes a first-receive-path amplifier arrangement configured to amplify the reflected radar signals prior to their provision to the first analogue to digital converter and the second-receive-path amplifier arrangement is configured to provide for greater amplification than the first-receive-path amplifier arrangement.

In one or more embodiments, one or more of the first-receive-path amplifier arrangement and the second-receive-path amplifier arrangement comprises at least one programmable gain amplifier.

In one or more embodiments, the receive path arrangement includes a digital signal processor for performing the digital signal processing, the digital signal processor configured to receive digital signals from the first analogue to digital converter and digital signals from the second analogue to digital converter and combine them.

In one or more embodiments, the radar sensor includes a blocker filter configured to provide filtered signals to at least the first receive path by attenuation of the reflected radar signals having frequencies less than a second intermediate beat frequency, the second intermediate beat frequency less than the intermediate beat frequency, and passing reflected radar signals having frequencies above the second intermediate beat frequency.

In one or more examples, the blocker filter comprises one of a high pass filter or band pass filter.

In one or more embodiments, the first receive path and the second receive path comprise separate branches after the blocker filter.

In one or more examples, the blocker filter forms part of the first receive path.

In one or more embodiments, one or more of the first receive path and the at least second receive path includes a low pass filter configured to attenuate the reflected radar signals that have frequencies above an upper out-of-band frequency threshold.

In one or more embodiments, the first receive path and the second receive path share one or more of a low-noise amplifier configured to amplify reflected radar signals received by an antenna and a mixer configured to receive the radar signal that is provided for transmission and which is reflected by the objects to form the reflected radar signal, the mixer configured to mix the reflected radar signal with the radar signal to determine a difference therebetween.

In one or more embodiments, the intermediate beat frequency of the second receive path filter is between 500 kHz and 20 MHz, or preferably between 3 and 7 MHz or substantially 5 MHz.

In one or more embodiments, the second intermediate beat frequency comprises between 50 kHz and 400 kHz or preferably between 50 kHz and 200 kHz or substantially 100 kHz.

In one or more embodiments, at least one of a second-receive-path filter and the second-receive-path amplifier arrangement are configured to receive a control signal from a controller to provide for configuration of their cut-off frequency or gain, respectively.

In one or more embodiments the receive path arrangement comprises a third receive path configured to receive reflected radar signals for detection and ranging of objects in a space around the radar sensor, the third receive path including a third receive path filter configured to provide filtered signals by attenuation of the reflected radar signals having frequencies between the first beat frequency and at least up to a third intermediate beat frequency greater than the intermediate beat frequency, the third receive path further including a third-receive-path amplifier arrangement configured to provide amplified signals by amplification of the filtered signals and provide the amplified signals to a third analogue to digital converter for subsequent digital signal processing.

In one or more examples, we provide a radar sensor including the receive path arrangement of the first aspect and a transmitter path configured to transmit a radar signal of FMCW type, the receive path arrangement configured to receive reflections of the radar signal.

According to a second aspect of the present disclosure there is provided a method comprising providing control of a receive path arrangement of a radar sensor of frequency modulated continuous wave type comprising a first receive path and at least a second receive path, the first and the at least second receive paths configured to receive reflected radar signals for detection and ranging of objects in a space around the radar sensor; the method comprising;

providing received reflected radar signals between a first beat frequency and a second beat frequency to a first analogue to digital converter for subsequent digital signal processing;

providing amplified and filtered signals to a second analogue to digital converter for subsequent digital signal processing, wherein filtered signals are provided by attenuation of the reflected radar signals having frequencies below an intermediate beat frequency and passing the reflected radar signals above the intermediate beat frequency, the intermediate beat frequency between the first and second beat frequencies, and the filtered signals are amplified to provide the amplified and filtered signals.

According to a third aspect of the present disclosure there is provided a radar sensor having the receive path arrangement of the first aspect.

According to a fourth aspect of the present disclosure there is provided an automobile comprising a radar sensor of the third aspect.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which.

Figure 1:
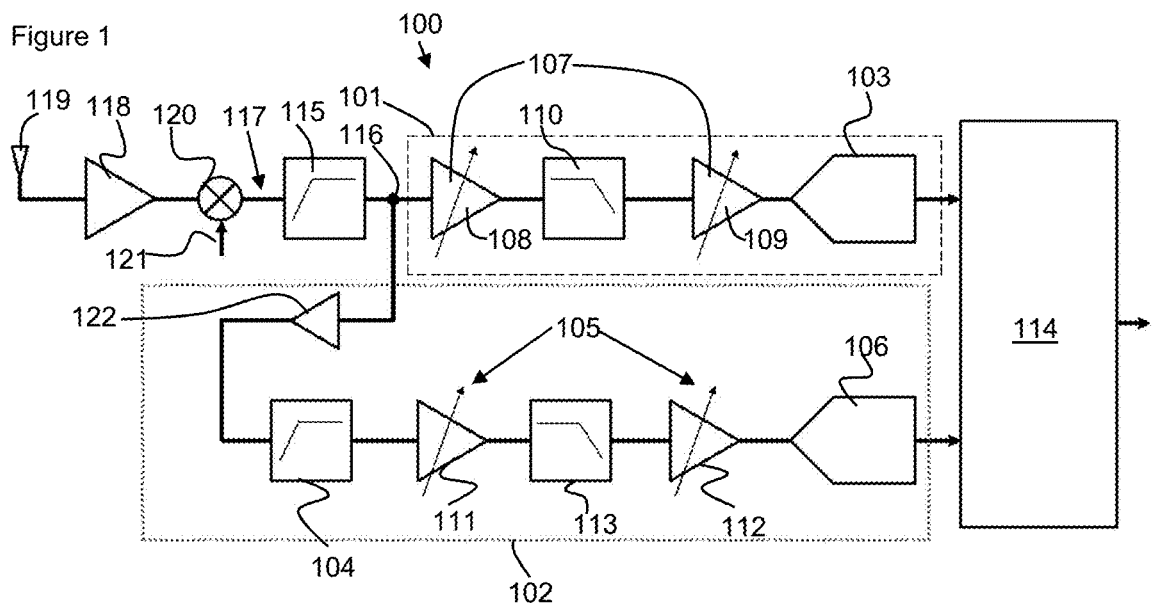
FIG. 1 shows an example embodiment comprising a block diagram of a receive path arrangement of a radar sensor.

Radar sensors are being used more widely and, in particular, but not exclusively, in automotive applications for traffic monitoring, parking assistance, lane departure warning, and recently in active collision avoidance and adaptive cruise control systems. As the number of radar sensors used for a particular application, such as in a vehicle, is increasing it may be important to provide a low cost and flexible radar sensor.

Radar (originally an acronym, RADAR) stands for RAdio Detection And Ranging. While radar technology was originally directed towards the use of radio frequency electromagnetic waves for detection and ranging, this term is now often used generically for electromagnetic waves of any frequency that are used for detection and ranging purposes. For example, it is common for automotive radar sensors to operate at the 77-81 GHz band.

A radar sensor performs detection and ranging by emitting an electromagnetic wave, such as a pulse or continuous wave, from a transmission antenna and measuring the time taken for a reflected wave to be detected at a receiving sensor. The amount of time taken for a reflected wave to reach an object and be reflected back provides an indication of the distance of that object from the radar element. By using a series of pulses or a continuous wave mode of operation (such as in a continuous wave radar), a time-resolved distance profile of a space around a radar system may be obtained. A radar element may also be configured to determine the speed of an object.

Frequency modulated continuous wave (FMCW) radar is a type of radar that provides for the transmittal of a radar signal comprising a frequency modulated signal. The radar signal may be frequency-modulated according to a predefined pattern of "chirps". The chirp may therefore comprise a discrete, frequency varying element of the radar signal and wherein a stream of known chirps in accordance with a known pattern form the FMCW radar signal.

The returned radar signals, due to reflections from objects in a space around the sensor, are time-delayed copies of the transmitted radar signal. By analysing differences between the transmitted and received signal, the range and velocity information of objects can be obtained.

A FMCW radar sensor may include a transmitter path for transmitting the radar signal, a receive path for receiving reflections of the radar signal (which may be combined with any other electromagnetic signals in the space), a chirp control element for providing control of the frequency modulations applied to the transmitted signals to effect the transmitted FMCW radar signal and a digital signal processing (DSP) module for controlling the chirp control element and processing the received reflected radar signals to derive spatial information about objects in the space around the sensor.

For FMCW radar based systems, the range of an object, i.e. distance from the radar sensor, is related to the beat frequency of the transmitted and reflected radar signals. As will be known to those skilled in the art, the beat frequency is the frequency difference between the transmitted and the reflected radar signals' frequencies. The following equation gives the range of an object;

$$R = \frac{t_m C}{2\Delta f} f_b$$

Where $t_m$ is the chirp duration, C is the speed of light, $f_b$ is the beat frequency and $\Delta f$ is the chirp frequency range.

In a radar system, the signal power reflected back to the receiver from the targets decays aggressively with respect to the distance from the radar sensor to the object (40 dB per decade), and returned signal power also varies with the targets' radar cross section (e.g. approximately −20 dB for typical pedestrian to approximately 10 dB for a typical car).

Figure 2:
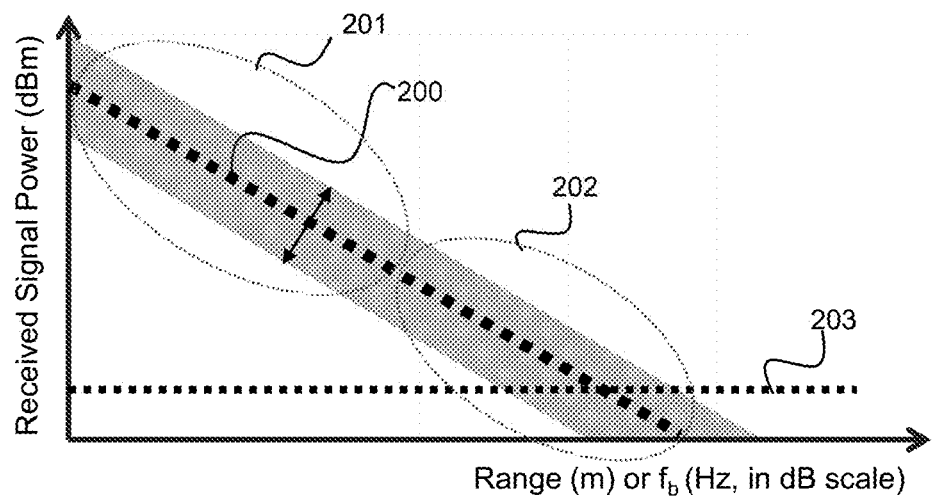
FIG. 2 shows a graph illustrating an example of the signal power of reflected radar signals versus range from the radar sensor or beat frequency.

FIG. 2 illustrates the typical signal power trend 200 of reflected radar signal received by a radar sensor vs. beat frequency (or range given the relationship between beat frequency and range). It will be appreciated that this assumes a constant transmitted radar signal power. The width of the trend 200 may be representative of a variation in received signal power due to differing radar cross sections of objects in the space. It can be seen that signals received in a first beat frequency region 201 may be considered to represent nearby objects and signals received in a second beat frequency region 202 may be considered to represent far away objects. The difference in signal power between the reflected radar signal in region 201 and the reflected radar signal in region 202 can be significant. Further, the radar sensor may have a detection threshold 203 representing a signal power below which information cannot be reliably extracted from the reflected radar signal. Thus, a signal in the region 202 may fall below the detection threshold 203.

Further, there are other sources of noise that may make extraction of information from the reflected radar signals difficult. While some of this noise may be reduced by repetitive measurements and averaging, there are some sources of noise that may be difficult to deal with. For example, the successful processing of signals in region 202 may be more susceptible to signal spurs (i.e. unwanted harmonic tones) due to the static nonlinearity of an analogue to digital convertor; analogue to digital converter dynamic errors; and self-interference in a system on a chip (SOC) environment such as from noise/spikes related to a clock, one or more power supplies, a substrate, a digital core, etc.

In one or more examples, it may be advantageous to provide a radar sensor configured to reliably receive reflected radar signals over regions 201 and 202.

FIG. 1 shows a first example embodiment of a receive path arrangement 100 of a radar sensor. The radar sensor is of frequency modulated continuous wave type in which a transmitter path (not shown) provides for the transmittal of a radar signal, which may comprise a series of chirps of known pattern. The receive path arrangement 100 comprises a first receive path 101 and a second receive path 102. It will be appreciated that in one or more examples there may be a third, fourth, fifth or more receive paths. The receive paths 101, 102 are each configured to receive the radar signal that has reflected from one or more objects in a space around the radar sensor for detection and ranging of the object(s). It will be appreciated that along with the reflected radar signals (i.e. the transmitted radar signal that has reflected from one or more objects), the receive paths may receive other signals from the space such as interference or radar signals from other radar sensors. Thus, more generally, the first and second receive paths 101, 102 may be considered to receive "received signals" which include the reflected radar signals.

The first receive path 101 is configured to provide reflected radar signals between a first beat frequency and a higher second beat frequency to a first analogue to digital converter (ADC) 103 for subsequent digital signal processing. The first and second beat frequency may be considered to define the beat frequency range in which specific beat frequencies, that is specific beat frequencies that represent the detection of an object, may be identified. The first and second beat frequencies may be set to define a frequencies at which specific beat frequencies are expected or it is desirable for the receive path arrangement to detect. Thus, the term "beat frequency" is used to refer to the frequency difference between the transmitted and the reflected radar signals' frequencies and "specific beat frequency" is used to refer to the characteristic beat frequency caused by the presence of an object in the space. As mentioned above, the beat frequency is indicative of distance from the radar sensor and nearer objects reflect more signal power. Thus, the first receive path 101 may be considered to be configured to receive lower beat frequency and higher signal power reflected radar signals in a first frequency band.

The second receive path 102 includes a second-receive-path filter 104 configured to provide filtered signals by attenuation of the reflected radar signals having frequencies below an intermediate beat frequency and passing of the reflected radar signals above the intermediate beat frequency. The intermediate beat frequency is configured between the first and second beat frequencies (or equal to the second beat frequency). The intermediate beat frequency, in this example, is defined by the corner or cut off frequency of the second-receive-path filter 104 between its pass band and a transition band, the transition band located between its passband and stopband. Accordingly, the intermediate beat frequency can be set to provide for attenuation of any received, low, specific beat frequencies that inherently have high signal power. The width of the transition band of the second-receive-path filter 104 may be configured to provide a ramp down of the signal power of specific beat frequencies as the beat frequency decreases beyond the intermediate beat frequency. Thus, for the second receive path 101, the second-receive-path filter 104 may be configured to attenuate the received signals with lower beat frequencies, higher signal power reflected radar signals up to the intermediate beat frequency. The second receive path 102 may be considered to be configured to receive reflected radar signals with higher beat frequencies with lower signal power (compared to the first receive path 101) and therefore in a second frequency band higher than the first frequency band. The first and second frequency bands may overlap or may be distinct.

In one or more examples, the first frequency band may comprise a wide band (between the first and second beat frequencies) and the second frequency band may comprise, at least in part, a high subset of frequencies of the wide band (because beat frequencies below the intermediate beat frequency are attenuated). Thus, in this example, an average frequency of the second band is higher than the average frequency of the first band. In one or more examples, the intermediate beat frequency may be substantially equal to the second beat frequency and therefore the majority of the second frequency band or substantially the whole of the second frequency band may be above the second beat frequency. It will be appreciated that the degree of overlap in frequency between the first and second frequency bands may be dependent on the particular application.

The second receive path 102 further includes a second-receive-path amplifier arrangement 105 configured to provide amplified signals by amplification of the filtered signals and provide the amplified signals to a second analogue to digital converter 106 for subsequent digital signal processing. Thus, as higher beat frequency radar signals typically have lower signal power (as shown in FIG. 2), the second-receive-path amplifier arrangement 105 may provide for greater amplification than any one or more amplifiers (if present) of the first receive path 101. This may be advantageous as the second-receive-path filter may filter out the low beat frequency, higher signal power radar signals leaving the lower signal power, higher beat frequency radar signals for amplification by the amplifier arrangement 105. Thus, the apparatus 100 may effectively provide for analogue processing of the radar signals having a wide range of signal powers by providing a plurality of receive paths 101, 102 that filter based on beat frequency.

The second-receive-path filter 104 may comprise a high pass filter having its cut-off frequency configured at the intermediate beat frequency. However, it will be appreciated that a band-pass filter, with its lower cut-off frequency configured at the intermediate beat frequency and a higher cut-off frequency configured at higher than the intermediate beat frequency and, in one or more examples, higher than the second beat frequency, may provide a similar function.

Figure 3:
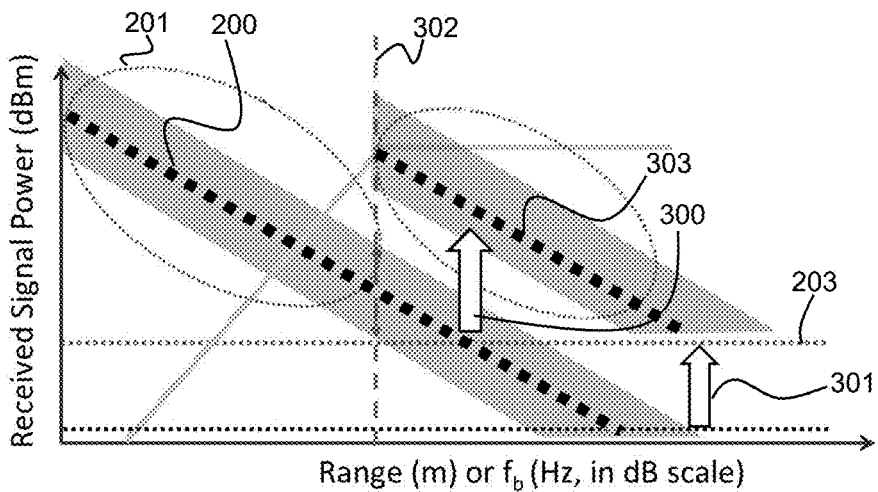
FIG. 3 shows the graph of FIG. 2 illustrating an example effect of the first and second receive paths.

FIG. 3 shows, similar to FIG. 2, the typical signal power trend 200 of the reflected radar signal received by a radar sensor vs. beat frequency (or range given the relationship between beat frequency and range). FIG. 3 additionally shows the effect of the second-receive-path filter 104 and the second-receive-path amplifier arrangement 105. In this figure, for simplicity, the filter 104 is shown to operate without a transition band between its passband and stopband, shown by frequency split line 302. The arrows 300, 301 show that the higher beat frequency and lower signal power reflected radar signals (compared to the first receive path 101) have been amplified to a higher signal power, shown as line 303 compared to trend 200. This amplification by the second-receive-path amplifier arrangement 105 may increase the amplitude of the reflected radar signals above the detection threshold 203. Accordingly, the higher beat frequency signals may now have a signal power more comparable with the lower beat frequency signals.

The first receive 101 path includes a first-receive-path amplifier arrangement 107 configured to amplify the reflected radar signals prior to their provision to the first analogue to digital converter 103. The second-receive-path amplifier arrangement 105 is configured to provide for greater amplification than the first-receive-path amplifier arrangement 107. Accordingly, the radar signals provided to the second ADC 106 are amplified to a greater degree that the radar signals provided to the first ADC 103. In one or more examples (not shown), the amplification on the receive paths 101, 102 may be substantially the same but the ADC of each path is configured to be responsive to the different signal powers received on each receive path. More generally, the first ADC 103 may be of a different type or the same type as the second ADC 106.

The first-receive-path amplifier arrangement 107, in this example, comprises two amplifiers comprising first first-receive-path amplifier 108 and second first-receive-path amplifier 109. The first and second first-receive-path amplifiers 108, 109 are separated, in the receive path 101, by a first low pass filter 110.

The second-receive-path amplifier arrangement 105, in this example, comprises two amplifiers comprising first second-receive-path amplifier 111 and a second second-receive-path amplifier 112. The first and second second-receive-path amplifiers 111, 112 are separated, in the receive path 102, by a second low pass filter 113.

One or more of the first and second first-receive-path amplifier 108, 109 and the first and second second-receive-path amplifier 111, 112 comprise at least one programmable gain amplifier. In this example, the amplifiers 108, 109, 111, 112 are all programmable gain amplifiers.

The first and second low pass filters 110, 113 are configured to attenuate the reflected radar signals that have frequencies above an upper out-of-band frequency threshold. For example, environment-originating signals having such frequencies or harmonics of reflected radar signals are filtered by the low pass filters 110, 113. In one or more examples, the second beat frequency is defined by the cut-off frequency of the low pass filter 110. In one or more other examples, the upper out-of-band frequency threshold may be higher than the second beat frequency and the second beat frequency may be defined by beat frequency at which the specific beat frequency trend 200 crosses the detection threshold. Thus, the second beat frequency may be considered to be the highest beat frequency that is detectable by the components of the first receive path 101. The second low pass filter 113 may have the same cut off frequency as the first low pass filter 110 or the cut-off frequencies may be different. For example, the cut-off frequency of the second low pass filter may be at a higher beat frequency than the cut-off frequency of the first low pass filter 110.

The radar sensor 100 may include a digital signal processor (DSP) 114 for performing the digital signal processing of the reflected radar signals. The digital signal processor 114 is configured to receive digital signals from the first analogue to digital converter 103 and digital signals from the second analogue to digital converter 106 and combine them. The combining may be performed by identifying the specific beat frequencies of objects in the space having beat frequencies that are within the frequency range provided by the first receive path and having beat frequencies that are within the higher frequency range provided by the second receive path. The digital signal processor 114 may form part of the radar sensor or, in other embodiments, the radar sensor 100 may be configured to provide for making of a connection between the ADCs 103, 106 and a DSP 114 of a separate integrated circuit.

The radar sensor 100 includes a blocker filter 115 configured to provide filtered signals to at least the first receive path 101 by attenuation of the reflected radar signals having frequencies below a second intermediate beat frequency, the second beat intermediate beat frequency less than the intermediate beat frequency, and passing reflected radar signals having frequencies above the second intermediate beat frequency. In one or more examples, the blocker filter comprises one of a high pass filter or band pass filter. The blocker filter is configured with a transition region that extends between the first beat frequency and the second intermediate beat frequency. The blocker filter 115 may be configured to reduce the signal power of the reflected radar signals that have the very low beat frequencies and are therefore very close to the radar sensor 100 (which may be based on the desired performance or specification of the radar sensor). Accordingly, the first beat frequency may be considered to be defined as the corner frequency between a transition band and a stop band of the blocker filter 115, or at least the beat frequency in the transition band at which the signal power of potential, specific beat signals falls below the detection threshold 203.

In this example, the first receive path 101 and the second receive path 102 are formed by branches from a node 116 located after the blocker filter 115. In one or more examples, the node 116 may be positioned in advance of the blocker filter 115 at position 117 and, accordingly, the blocker filter 115 may form part of the first receive path 101. In one or more examples, the node 116 may be positioned between the first first-receive-path amplifier 108 (and therefore the first first-receive-path amplifier 108 may actually comprise a shared amplifier as it technically no longer forms part of the first receive path) and the first high pass filter 110.

The radar sensor 100 further includes a low-noise amplifier 118 (or more generally an amplifier) configured to receive the reflected radar signals from an antenna 119. The low-noise amplifier is configured to amplify reflected radar signals received at the antenna 119. The radar sensor 100 further includes a mixer 120 configured to mix the reflected radar signals with the radar signals that are transmitted to determine the occurrence of a beat frequency. Accordingly, in this example, the beat frequencies are calculated from the received signal frequencies minus the frequencies of a local oscillator signal 121. The mixer 120 is configured to receive the amplified signals from the low-noise amplifier 118 and mixes it with a local oscillator signal 121, which is based on or comprises the transmitted radar signals.

Accordingly, in this example, the low-noise amplifier 118 and mixer 120 comprise components that are shared by the first and second receive paths 101, 102. However, in other examples, each receive path 101, 102 may include one or both of the low-noise amplifier and mixer 120.

The radar sensor 100 may comprises an optional buffer 122 between the node 116, which denotes where the first and second receive paths branch from, and the second-receive-path filter 104. The buffer 122 may comprise an amplifier and, in one or more examples, may be configured to have unity gain. The buffer 122 may be configured to prevent the effect of the second-receive-path filter 104 influencing the signals of the first receive path.

Figure 4:
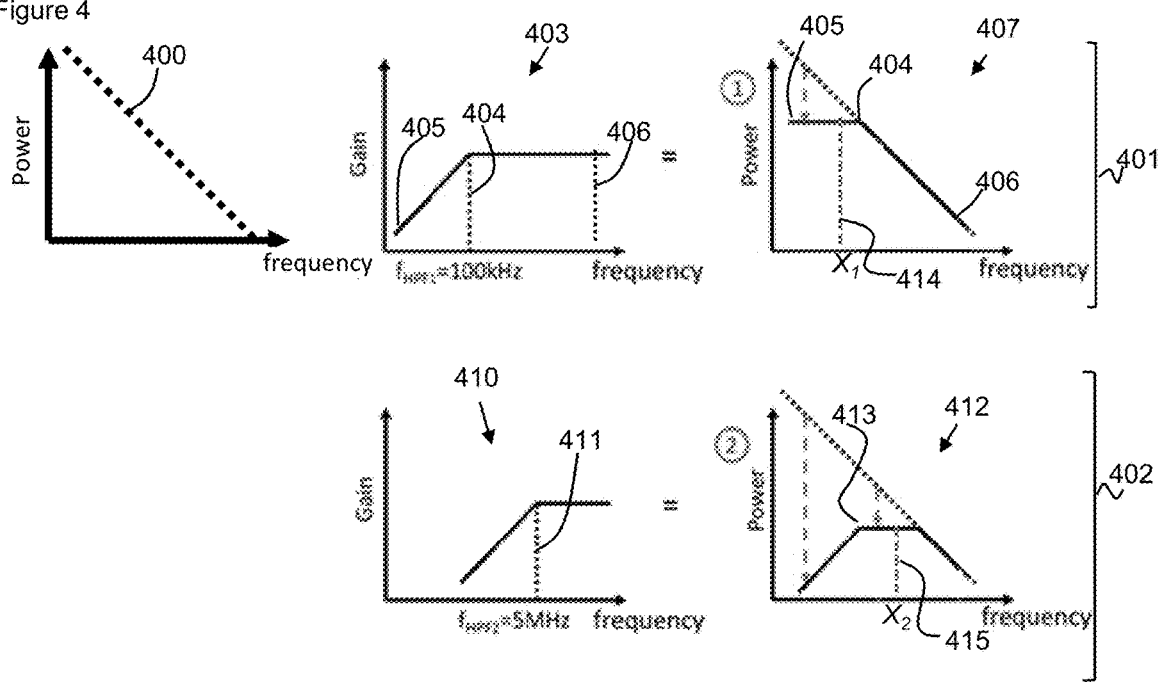
FIG. 4 shows example filter transfer functions of the first and second receive paths.

FIG. 4 shows the received, reflected radar signal 400 with its general shape of decreasing signal power with increasing beat frequency. The transfer function of the first receive path 101 is shown at 401 and the transfer function of the second receive path is shown at 402. Graph 403 shows the transfer function of the blocker filter 115, which comprises a high pass filter. The blocker filter has a cut-off frequency of substantially 100 kHz, shown at 404, which comprises the second intermediate beat frequency. In this example, the first beat frequency is substantially 10 kHz and is shown at 405 and the second beat frequency is substantially 10 MHz, shown at 406. The transition region of the blocker filter 115 (between the passband and stopband) extends between the first beat frequency 405 and the second intermediate beat frequency 404. Graph 407 shows the effect of the blocker filter 115 on the received, reflected radar signal. Accordingly, the blocker filter 115 suppresses the signal power of the beat frequencies having the highest signal power between the first beat frequency 405 and the second intermediate beat frequency 404 or, more generally, below the second intermediate beat frequency 404. As shown in FIG. 2, the first receive path includes the first low pass filter 110 which is shown in graph 407 as attenuating signals above the second frequency 406.

Graph 410 shows the transfer function of the second receive path filter 104, which comprises a high pass filter. The second receive path filter 104 has a cut off frequency, comprising the intermediate beat frequency 411 at substantially 5 MHz. The transition region of the second receive path filter 104, in this example, extends between the first beat frequency 405 and the intermediate beat frequency 411, although the frequency between the stop band and the transition region may comprise at least the first frequency 405 or substantially the second intermediate beat frequency 404 or at least the second intermediate beat frequency 404. It can be seen that the intermediate beat frequency 411 comprises a higher frequency than the second intermediate beat frequency 404.

Graph 412 shows the effect of the second receive path filter 104, in combination with the blocker filter 115, on the received, reflected radar signal. Accordingly, the filter 104 and blocker filter 115 suppresses the signal power of the beat frequencies having the highest signal power between the first beat frequency 405 and the intermediate beat frequency 411. It will be appreciated that the transfer function of the second receive path filter 104 may be configured to have a similar transfer function to the combined transfer function of the blocker filter 115 and second receive path filter 104 shown in graph 412. Thus, the filtered received radar signals shown as line 413 in graph 412 may be amplified without the lower beat frequency radar signals (now filtered out or suppresses) challenging the dynamic range of the amplifier arrangement 105 or second ADC 106. Comparing graph 407 and 412, it can be seen that the signal power of signals in a frequency band between the first and the intermediate beat frequencies are suppressed more in the second receive path 102 than in the first receive path 101. This may allow for greater amplification of the filtered signals of the second receive path 102 than the first receive path 101 for effective processing by the respective first and second ADC 103, 106 (without clipping, for example). Thus, the frequency 414 at which peak signal power occurs in the signals of the first receive path 101 may occur at a lower frequency than the frequency 415 at which peak signal power occurs in the filtered signals of the second receive path 102.

In the above example, the first and second beat frequencies 405, 406 may be set depending on the frequency range of the transmitted signal or any other application specific variables. The intermediate beat frequency may be selected based on the specification of the component of the first 101 and second 102 receive paths or in accordance with any other application specific variables. The second intermediate beat frequency may be selected based on the specification of the component of the first receive path 101 (and optionally second receive path 102) or in accordance with any other application specific variables.

While in the above example the intermediate beat frequency (or cut off/corner frequency) of the second receive path filter 104 is substantially 5 MHz, the intermediate beat frequency may comprise between 500 kHz and 7 MHz or between 3 MHz and 7 MHz.

While in the above example the second intermediate beat frequency (or cut off/corner frequency) of the blocker filter 115 is substantially 100 kHz, the second intermediate beat frequency may comprise between 50 kHz and 400 kHz or 50 kHz and 200 kHz.

Figure 5:
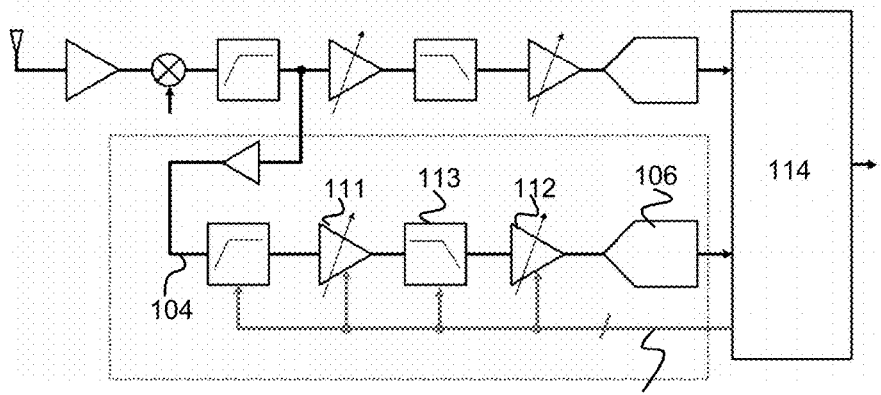
FIG. 5 shows a second example embodiment comprising a block diagram of receive path arrangement of a radar sensor.

FIG. 5 shows a second example embodiment substantially equivalent to FIG. 1 with the same reference numerals used for like parts. In this embodiment, the only difference is that the second receive path filter 104, the second-receive-path amplifier arrangement 105 and second low pass filter 113 are configured to receive control signals shown by control lines 500. The control signals may be provided by the DSP 114 or a different controller. In this embodiment all of the components of the second receive path 102 are controllable but in one or more embodiments one or more of the second receive path filter 104, the first second-receive-path amplifier 111, the second second-receive-path amplifier 112 and the second low pass filter 113 are controllable. The DSP 114 or other controller may be configured to actively control the components during use. In particular, the transfer function of the second receive path filter 104 may be controllable, such as position of the cut-off frequency. The gain of the first second-receive-path amplifier 111 may be controllable. The gain of the second second-receive-path amplifier 112 may be controllable. The transfer function of the second low pass filter 104 may be controllable, such as position of its cut-off frequency.

As mentioned above, more than two receive paths may be provided each configured to process, in the analogue domain, a different frequency range for provision to a respective ADC. For example, a first, second and third receive path radar sensor may be provide to process received signals with low, medium and high beat frequencies respectively. A first receive path may be configured to process received signals with low beat frequencies and may include at least high, low or band pass filters to filter out or suppress of band frequencies. The first receive path may include one or more amplifiers configured to provide a first gain level. A third receive path may be configured to process received signals with high beat frequencies and may include a high pass or band pass filter to filter out or suppress at least the low beat frequency signals and, optionally the medium beat frequency signals. The third receive path may include one or more amplifiers configured to provide a third gain level higher than the first gain level. A second receive path may be configured to process received signals with medium beat frequencies and may include a band pass filter to filter out or suppress the low and high beat frequency signals. The second receive path may include one or more amplifiers configured to provide a second gain level higher than the first gain level and lower than the third gain level.

Thus, the third receive path may be configured to receive reflected radar signals for detection and ranging of objects in a space around the radar sensor, the third receive path including a third receive path filter configured to provide filtered signals by attenuation of the reflected radar signals with beat frequencies below a third intermediate beat frequency greater than the intermediate beat frequency, the third receive path further including a third-receive-path amplifier arrangement configured to provide amplified signals by amplification of the filtered signals and provide the amplified signals to a third analogue to digital converter for subsequent digital signal processing.

In one or more examples, the radar sensor may comprise multiple radar receiver paths, each with a dedicated antenna and wherein each (or one or more of the) radar receiver paths may comprise the receive path arrangement 100 of FIG. 1 or FIG. 5.

Figure 6:
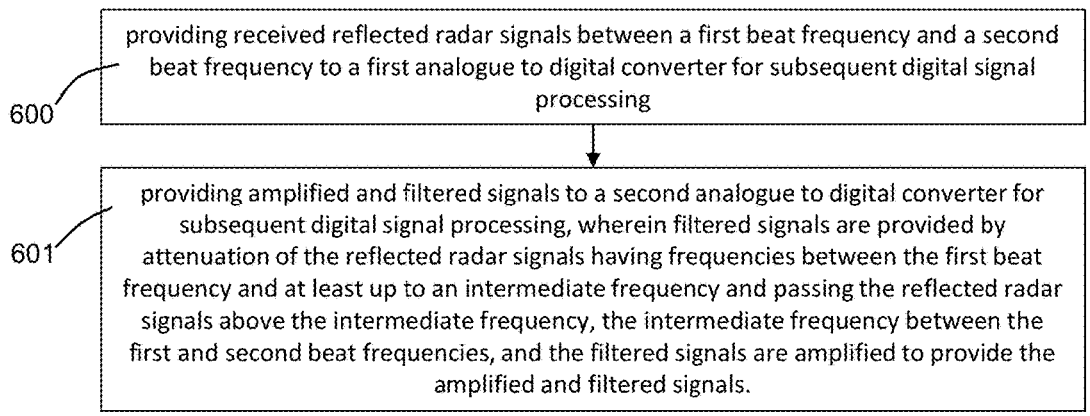
FIG. 6 shows a flow chart illustrating an example embodiment of a method.

FIG. 6 illustrates a method comprising providing control of a radar sensor of frequency modulated continuous wave type comprising a first receive path and at least a second receive path, the first and the at least second receive paths configured to receive reflected radar signals for detection and ranging of objects in a space around the radar sensor; the method comprising;
    providing 501 received reflected radar signals between a first beat frequency and a second beat frequency to a first analogue to digital converter for subsequent digital signal processing; and
    providing 502 amplified and filtered signals to a second analogue to digital converter for subsequent digital signal processing, wherein filtered signals are provided by attenuation of the reflected radar signals having frequencies between the first beat frequency and at least up to an intermediate beat frequency and passing the reflected radar signals above the intermediate beat frequency, the intermediate beat frequency between the first and second beat frequencies, and the filtered signals are amplified to provide the amplified and filtered signals.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/ method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A receive path arrangement of a radar sensor of frequency modulated continuous wave type comprising a first receive path and at least a second receive path, the first and the at least second receive paths configured to receive reflected radar signals for detection and ranging of objects in a space around the radar sensor;
    the first receive path configured to provide reflected radar signals between a first beat frequency and a second beat frequency to a first analogue to digital converter for subsequent digital signal processing and wherein;

the second receive path includes a second-receive-path filter configured to provide filtered signals by attenuation of the reflected radar signals having frequencies below an intermediate beat frequency and passing the reflected radar signals above the intermediate beat frequency, the intermediate beat frequency between the first and second beat frequencies, the second receive path further including a second-receive-path amplifier arrangement configured to provide amplified signals by amplification of the filtered signals and provide the amplified signals to a second analogue to digital converter for subsequent digital signal processing.

2. The receive path arrangement of claim 1, wherein by virtue of at least the second-receive-path filter, the first receive path is configured to provide reflected radar signals in a first frequency band to the analogue to digital converter and the second receive path is configured to provide reflected radar signals in a second frequency band higher than the first frequency band.

3. The receive path arrangement of claim 1, wherein the first receive path includes a first-receive-path amplifier arrangement configured to amplify the reflected radar signals prior to their provision to the first analogue to digital converter and the second-receive-path amplifier arrangement is configured to provide for greater amplification than the first-receive-path amplifier arrangement.

4. The receive path arrangement of claim 3, wherein one or more of the first-receive-path amplifier arrangement and the second-receive-path amplifier arrangement comprises at least one programmable gain amplifier.

5. The receive path arrangement of claim 1, including a digital signal processor for performing the digital signal processing, the digital signal processor configured to receive digital signals from the first analogue to digital converter and digital signals from the second analogue to digital converter and combine them.

6. The receive path arrangement of claim 1, wherein the radar sensor includes a blocker filter configured to provide filtered signals to at least the first receive path by attenuation of the reflected radar signals having frequencies less than a second intermediate beat frequency, the second intermediate beat frequency less than the intermediate beat frequency, and passing reflected radar signals having frequencies above the second intermediate beat frequency.

7. The receive path arrangement of claim 6, wherein the first receive path and the second receive path comprise separate branches after the blocker filter.

8. The receive path arrangement of claim 1, wherein one or more of the first receive path and the at least second receive path includes a low pass filter configured to attenuate the reflected radar signals that have frequencies above an upper out-of-band frequency threshold.

9. The receive path arrangement of claim 1, wherein the first receive path and the second receive path share one or more of a low-noise amplifier configured to amplify reflected radar signals received by an antenna and a mixer configured to receive the radar signal that is provided for transmission and which is reflected by the objects to form the reflected radar signal, the mixer configured to mix the reflected radar signal with the radar signal to determine a difference therebetween.

10. The receive path arrangement of claim 1, wherein the intermediate beat frequency of the second receive path filter is between 500 kHz and 20 MHz.

11. The receive path arrangement of claim 6, wherein second intermediate beat frequency comprises between 50 kHz and 400 kHz.

12. The receive path arrangement of claim 1, wherein at least one of a second-receive-path filter and the second-receive-path amplifier arrangement are configured to receive a control signal from a controller to provide for configuration of their cut-off frequency or gain, respectively.

13. The receive path arrangement of claim 1, comprising a third receive path configured to receive reflected radar signals for detection and ranging of objects in a space around the radar sensor, the third receive path including a third receive path filter configured to provide filtered signals by attenuation of the reflected radar signals having frequencies between the first beat frequency and at least up to a third intermediate beat frequency greater than the intermediate beat frequency, the third receive path further including a third-receive-path amplifier arrangement configured to provide amplified signals by amplification of the filtered signals and provide the amplified signals to a third analogue to digital converter for subsequent digital signal processing.

14. A method comprising providing control of a receive path arrangement of a radar sensor of frequency modulated continuous wave type comprising a first receive path and at least a second receive path, the first and the at least second receive paths configured to receive reflected radar signals for detection and ranging of objects in a space around the radar sensor; the method comprising;
  providing received reflected radar signals between a first beat frequency and a second beat frequency to a first analogue to digital converter for subsequent digital signal processing;
  providing amplified and filtered signals to a second analogue to digital converter for subsequent digital signal processing, wherein filtered signals are provided by attenuation of the reflected radar signals having frequencies below an intermediate beat frequency and passing the reflected radar signals above the intermediate beat frequency, the intermediate beat frequency between the first and second beat frequencies, and the filtered signals are amplified to provide the amplified and filtered signals.

15. A radar sensor having the receive path arrangement of claim 1.

* * * * *